United States Patent [19]

Lee et al.

[11] Patent Number: 4,852,023

[45] Date of Patent: Jul. 25, 1989

[54] NONLINEAR RANDOM SEQUENCE GENERATORS

[75] Inventors: Lin-Nan Lee, Potomac; Farhad Hemmati, Germantown, both of Md.

[73] Assignee: Communications Satellite Corporation, Clarksburg, Md.

[21] Appl. No.: 48,697

[22] Filed: May 12, 1987

[51] Int. Cl.⁴ .................. G06F 1/02; H03B 29/00
[52] U.S. Cl. .................................. 364/717; 331/78
[58] Field of Search ............. 364/717; 380/46, 47, 380/50; 331/78

[56] References Cited

U.S. PATENT DOCUMENTS

| | | | |
|---|---|---|---|
| 3,614,316 | 5/1964 | Andrews et al. | 178/22 |
| 3,784,743 | 1/1974 | Schroeder | 380/50 |
| 3,911,216 | 10/1975 | Bartek et al. | 178/22 |
| 4,004,089 | 1/1977 | Richard et al. | 380/36 |
| 4,115,657 | 9/1978 | Morgan | 178/22 |
| 4,202,051 | 5/1980 | Davida et al. | 375/2 |
| 4,225,935 | 9/1980 | Zscheile | 364/717 |
| 4,325,129 | 4/1982 | Groth | 364/717 |
| 4,649,419 | 3/1987 | Arragon et al. | 380/46 |
| 4,685,132 | 8/1987 | Bishop et al. | 380/46 |

OTHER PUBLICATIONS

IEEE Transactions of Information Theory, vol. IT-22, No. 6, Nov. 1976, pp. 732-736, E. L. Key; "An Analysis of the Structure and Complexity of Nonlinear Binary Sequence Generators".

IEE Transactions of Information Theory, vol. IT-17, No. 3, May 1971, pp. 288-296; E. J. Groth, "Generation of Binary Sequences with Controllable Complexity".

Primary Examiner—Gary V. Harkcom
Assistant Examiner—Dale M. Shaw
Attorney, Agent, or Firm—Sughrue, Mion, Zinn, Macpeak & Seas

[57] ABSTRACT

Linear and nonlinear bits are logically combined to form each of at least three sequences, one of which is selectively used to couple either one of the others to the output of the sequence generator.

17 Claims, 1 Drawing Sheet

NONLINEAR RANDOM SEQUENCE GENERATORS

BACKGROUND OF THE INVENTION

This invention is related to the field of communications security, and more particularly to a random sequence generator which may be used in maintaining communication security.

In systems where communications security is desired, it is common to encrypt or scramble the data to be transmitted, but the degree of security obtained is dependent upon the degree of difficulty encountered by an unauthorized user in determining the encryption key or the scrambling sequence employed. Thus, for secure communications, it is imperative that the encryption key or scrambling sequence have a high degree of randomness.

By classical definitions, a binary sequence is a random (looking) sequence if it satisfies the "randomness postulates" as presented by S. W. Golomb, *Shift Sequences*, Holden Day, San Francisco, 1967. It is well known that a sequence which satisfies the randomness postulates is not necessarily suitable for application in a secure system. The other desired properties for a good random sequence include the complexity of the sequence (defined according to some criteria) and problems related to its "invertibility," i.e., the complexity of computations required to find the "seed" from a block of output sequences assuming that the feedback function is known.

Thus, an essential component of many secure communications systems is the random sequence generator. Several techniques for the generation of random sequences are known with the simplest technique involving the use of a shift register with a linear or nonlinear feedback circuit. Non-linear feedback shift registers are more applicable and attractive for secure communications.

For a given m-stage shift register, about $2^{2^{m-1}-m}$ nonlinear feedback circuits exist such that the generated sequences satisfy the classical randomness postulates. Presently, there is no known general construction technique for designing a feedback function with reasonable complexity. Most of the analytical methods for constructing nonlinear sequences are based on concatenation of linear sequences, but it is not safe to use such sequences for security purposes.

A popular method for generating a nonlinear sequence is to apply a nonlinear function on a linear PN sequence, as shown in FIG. 1, This is commonly known as the Groth generator. In FIG. 1, the Linear Feedback Shift Register (LFSR) 10 generates a linear PN sequence, and the nonlinear function generator is schematically shown at 12. The main disadvantage of this technique is that an arbitrary choice of the nonlinear function generally does not lead to the generation of a sequence with desired randomness properties. Moreover, except for some special cases, e.g., as described by E. L. Key, "An Analysis of the Structure and Complexity of Non-linear Binary Sequence Generators," IEEE Transactions on Information Theory, November 1976, the complexity of the generated sequence has not been analyzed.

An alternative for generating nonlinear sequences is a sequence generator designed by Geffe and described in the above-cited reference by E. L. Key, Geffe's generator, illustrated in FIG. 2, consists of three linear feedback shift registers 14, 16 and 18, AND gates 20 and 22, with gate 22 having one inverted input 24, and a modulo-two adder (EXclusive-OR gate) 26. In this configuration the register 16 is used as a control register, to selectively connect the sequence from either the register 14 or the register 16, but not both, to the output via gate 26. If the present output from the controller register 16 is a logic 1, the output from register 14 is connected to gate 26 and to the sequence generator output. Otherwise, the output from register 18 becomes the sequence generator output.

The complexity of the sequence generator of FIG. 2, in terms of the number of stages of a linear feedback shift register which would exactly generate the same sequence, is equal to $rs+(s+1)t$, where r, s and t are the degree of primitive characteristic polynomials of shift registers 14, 16 and 18, respectively. The period of the output sequence is the least common multiple of $2^r-1$, $2^s-1$, and $2^t-1$.

The balanced distribution of zeros and ones at the output is the main advantage of the generator of FIG. 2. However, because of the involved linear terms, it is rather easy to find the "seed" from the output sequence. The complexity of the generator of FIG. 2 (Geffe's generator) can be increased by using Groth generators as the component registers. See the above-cited paper by E. L.. Key, as well as E. I.. Groth, "Generation of Binary Sequences with Controllable Complexity," IEEE Transaction on Information Theory, May 1971. In this case, however, the desired randomness properties are not guaranteed.

SUMMARY OF THE INVENTION

It is, therefore, an object of the present invention to provide random sequence generators which generate sequences of adequate complexity and randomness.

Briefly, the present invention achieves its advantageous combination of complexity and randomness by utilizing a structure generally similar to that of Geffe's generator in that at least first and second sequences are selectively gated to the sequence generator output by means of a control sequence. However, the first, second and control sequences in the preferred embodiment of the present invention result from a combination of linear and nonlinear sequences.

BRIEF DESCRIPTION OF THE DRAWINGS

The invention will be more clearly understood from the following description in conjunction with the accompanying drawings, wherein.

DETAILED DESCRIPTION OF THE INVENTION

Figure 1:
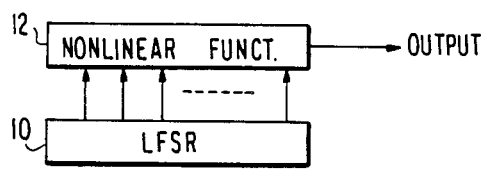
FIG. 1 is a block diagram of a conventional sequence generator applying a nonlinear function to the contents of a linear feedback shift register.
Figure 2:
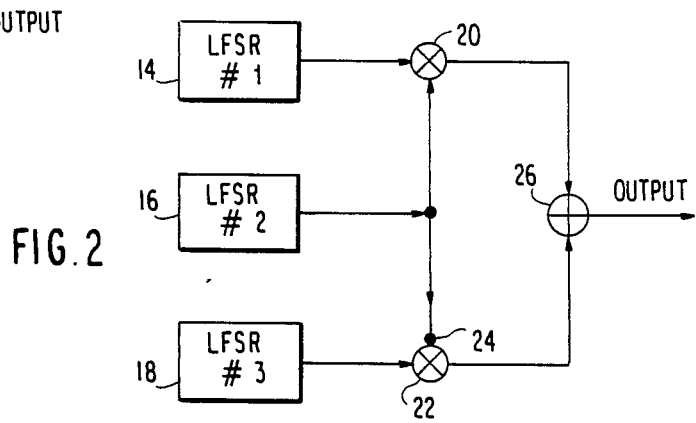
FIG. 2 is a diagram of a further nonlinear sequence generator known in the prior art.
Figure 3:
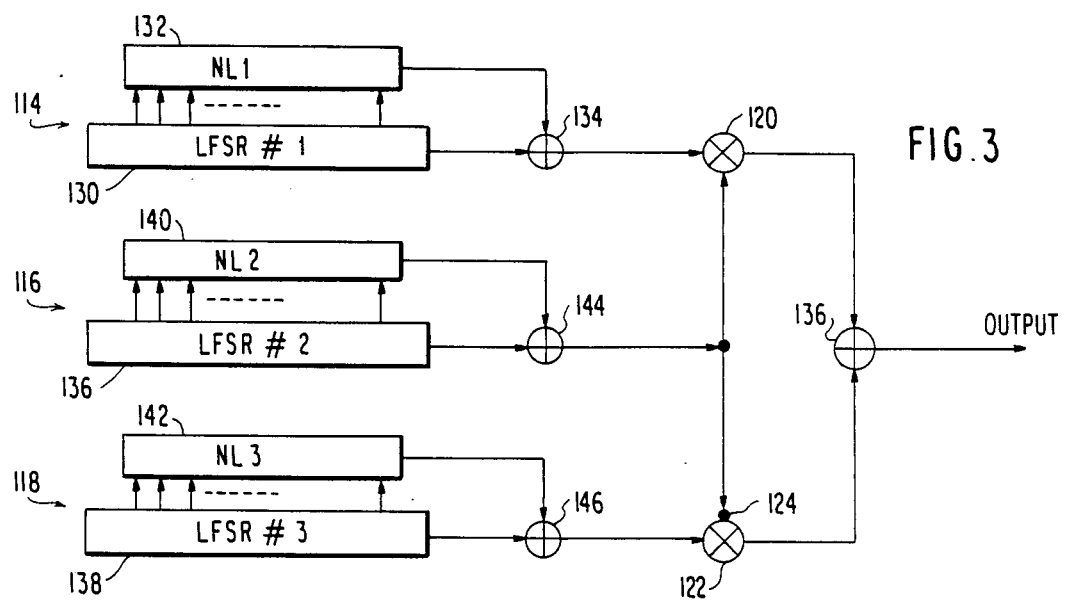
FIG. 3 is a block diagram of a sequence generator according to a first embodiment of the present invention.

A first embodiment of the invention will now be described with reference to FIG. 3. As can be seen from a comparison of FIGS. 2 and 3, FIG. 3 is essentially similar in its generation of three nonlinear sequences, with the second sequence being used as a control sequence to selectively gate either one of the first and third sequences to the output of the sequence generator. Thus, the function of gates 120, 122 and 126, and inverter 124, are essentially the same as the functions of the corresponding components 20 22, 26 and 24, respectively, in FIG. 2. The essential difference in the embodiment of the invention shown in FIG. 3 resides in the implementation of the sequence generators themselves. Instead of the simple linear feedback shift register 14 in FIG. 2, the embodiment of FIG. 3 forms its sequence generator 114 from a linear feedback shift register 130 which includes a nonlinear function schematically shown by block 132. The "seed," i.e., the initial state of the linear feedback shift register 130, can be any non-zero block of zeros and ones. At each clocking interval, the sequence generator 114 generates one linear bit and one nonlinear bit, the linear bit being produced by a linear function of the previously generated bits while the nonlinear bit is a nonlinear function of the previously generated linear bits. The linear and nonlinear bits are then combined in a modulo-two adder 134. The second and third sequence generators 116 and 118 are similarly constructed of linear feedback shift registers 136 and 138 having nonlinear functions 140 and 142, respectively, and the linear and nonlinear sequences being combined in AND gates 144 and 146.

The linear feedback shift registers 130, 136 and 138 in FIG. 3 are regulated by a clock and can include any number of stages r, s, and t, respectively, In order to construct a long cycle, it is preferred that r, s, and t be chosen such that $2^r-1$, $2^s-1$, and $2^t-1$ are relatively prime numbers, i.e., they share no common factors. The nonlinear functions NL1, NL2 and NL3 can be chosen according to Groth generators or any other function with a reasonable balance of zeros and ones.

Figure 4:
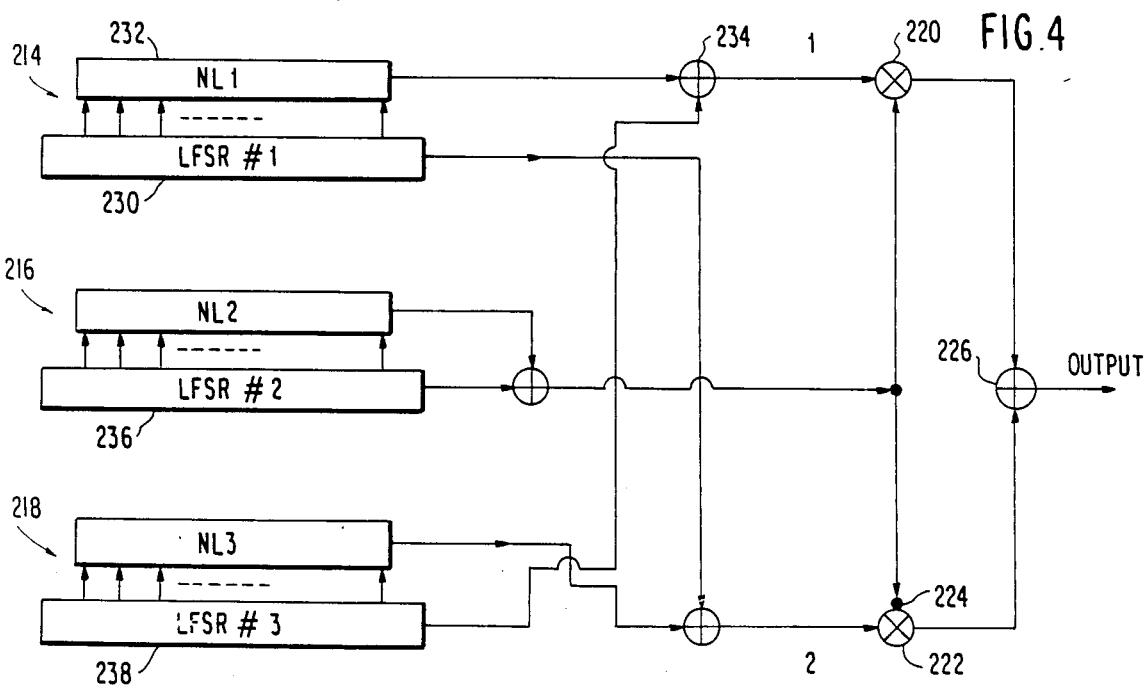
FIG. 4 is a block diagram of a sequence generator according to a second embodiment of the present invention.

The embodiment of FIG. 3 will generate a nonlinear sequence with a reasonable balance of zeros and ones. However, because of the linear terms in the configuration of FIG. 3, it can be shown that the system is somewhat vulnerable to cryptanalysis attack, i.e., it might be possible to find the seed from a block of output sequence. To overcome this problem, a second embodiment of the present invention is shown in FIG. 4. The linear and nonlinear bits from the second sequence generator 216 are modulo-two added in the same manner as the linear and nonlinear bits from the sequence generator 116 in FIG. 3. However, in the configuration of FIG. 4, the linear bit from the first shift register 230 is combined with the nonlinear bit of the third sequence generator, while the nonlinear bit of the first sequence generator is added to the linear bit of the third sequence generator. This will improve complexity, since the linear bits in any given combined sequence will be unrelated to the nonlinear bits of that sequence.

With the sequence generators implemented according to the present invention, there is an improvement in the complexity of computations necessary to find the seed from a block of output sequence. Extensive simulation tests have shown that the generated sequence has a good balance of zeros and ones, and its run length distribution is suprisingly close to the ideal case.

It should be appreciated that various changes and modifications can be made to the disclosed embodiments without departing from the spirit and scope of the invention as defined in the appended claims.

We claim:

1. A nonlinear sequence generator for generating a nonlinear sequence output, comprising:
    first generator means for generating a first sequence;
    second generator means for generating a second sequence;
    third generator means for generating a third sequence;
    fourth generator means for generating a fourth sequence;
    fifth generator means for generating a fifth sequence;
    sixth generator means for generating a sixth sequence;
    first combining means for combining said first and second sequences to obtain a first combined sequence;
    second combining means for combining said third and fourth sequences to obtain a second combined sequence;
    third combining means for combining said fifth and sixth sequences to obtain a third combined sequence; and
    output means for selectively passing one of said first and third combined sequences as said output nonlinear sequence in accordance with said second combined sequence.

2. A nonlinear sequence generator as defined in claim 1, wherein each of said first through sixth generator means comprise substantially random sequence generators and wherein each of said first through sixth sequences is substantially random.

3. A nonlinear sequence generator as defined in claim 1, wherein said first, third and fifth sequences are linear sequences with each bit of a sequence being a linear function of previous bits in said sequence.

4. A nonlinear sequence generator as defined in claim 3, wherein said second, fourth and sixth sequences are nonlinear sequences with each bit of one of said nonlinear sequences being a nonlinear function of previous bits in one of said linear sequences.

5. A nonlinear sequence generator as defined in claim 4 wherein each bit in said second sequence is a nonlinear function of previously generated bits in said first sequence.

6. A nonlinear sequence generator as defined in claim 5, wherein each bit in said fourth sequence is a nonlinear function of previously generated bits in said third sequence.

7. A nonlinear sequence generator as defined in claim 6, wherein each bit in said sixth sequence is a nonlinear function of previously generated bits in said fifth sequence.

8. A nonlinear sequence generator as defined in claim 4, wherein each bit in said sixth sequence is a nonlinear function of previously generated bits in said first sequence.

9. A nonlinear sequence generator as defined in claim 8, wherein each bit in said second sequence is a nonlinear function of previously generated bits in said fifth sequence.

10. A nonlinear sequence generator as defined in claim 1, wherein said first through third combining means comprise modulo-two adders.

11. A nonlinear sequence generator as defined in claim 10, wherein said fourth and fifth combining means comprise AND gates, with said fifth combining means having an inverted input for receiving said second combined sequence.

12. A nonlinear sequence generator as defined in claim 1, wherein said output means comprises:

fourth combining means for combining said first and second combined sequences to obtain a fourth combined sequence;

fifth combining means for combining said second and third combined sequences to obtain a fifth combined sequence; and sixth combining means for combining said fourth and fifth combined sequences to obtain said nonlinear sequence output.

13. A nonlinear sequence generator as defined in claim 12, wherein said sixth combining means comprises a modulo-two adder.

14. A nonlinear sequence generator as defined in claim 1, wherein said first, third and fifth generating means comprise linear feedback shift registers having r, s and t stages, respectively, where r, s and t are different integers.

15. A nonlinear sequence generator as defined in claim 14, wherein $2^r-1$, $2^s-1$ and $2^t-1$ are relatively prime.

16. A nonlinear sequence generator for generating an output nonlinear sequence, said sequence generator being of the type including first means for generating a first preliminary sequence, second means for generating a second preliminary sequence and means for combining said first and second preliminary sequences to form said output nonlinear sequence, said nonlinear sequence generator being further characterized in that:

said first means comprises first linear means for generating a first linear sequence of bits each of which is a linear function of previously generated bits in said first linear sequence, first nonlinear means for generating a first nonlinear sequence of bits each of which is a nonlinear function of previously generated bits of said first linear sequence, and first combining means for combining said first linear and nonlinear sequences to obtain said first preliminary sequence; and said second means comprises second linear means for generating a second linear sequence of bits each of which is a linear function of previously generated bits in said second linear sequence, second nonlinear means for generating a second nonlinear sequence of bits each of which is a nonlinear function of previously generated bits of said second linear sequence, and second combining means for combining said second linear and nonlinear sequences to obtain said second preliminary sequence.

17. A nonlinear sequence generator for generating an output nonlinear sequence, said sequence generator being of the type including first means for generating a first preliminary sequence, second means for generating a second preliminary sequence and means for combining said first and second sequences to form said output nonlinear sequence, said nonlinear sequence generator being further characterized in that said first and second means comprise:

first linear means for generating a first linear sequence of bits each of which is a linear function of previously generated bits in said first linear sequence;

first nonlinear means for generating a first nonlinear sequence of bits each of which is a nonlinear function of previously generated bits of said first linear sequence;

second linear means for generating a second linear sequence of bits each of which is a linear function of previously generated bits in said second linear sequence;

second nonlinear means for generating a second nonlinear sequence of bits each of which is a nonlinear function of previously generated bits of said second linear sequence;

first combining means for combining said first linear and second nonlinear sequences to obtain said first preliminary sequence; and second combining means for combining said second linear and first nonlinear sequences to obtain said preliminary second sequence.

* * * * *